United States Patent
Seidel et al.

(10) Patent No.: US 6,380,094 B1
(45) Date of Patent: Apr. 30, 2002

(54) METHOD FOR PREVENTING REDEPOSITION OF ETCHING PRODUCTS ONTO SUBSTRATE SURFACES DURING A TUNGSTEN RE-ETCHING PROCESS IN THE PRODUCTION OF LSI CIRCUITS

(75) Inventors: Uwe Seidel; Rainer Braun, both of München (DE)

(73) Assignee: Infineon Technologies AG, Munich (DE)

( * ) Notice: Subject to any disclaimer, the term of this patent is extended or adjusted under 35 U.S.C. 154(b) by 985 days.

(21) Appl. No.: 08/529,322

(22) Filed: Sep. 18, 1995

(30) Foreign Application Priority Data

Sep. 20, 1994 (DE) .......................... 44 33 538

(51) Int. Cl.⁷ .............................. H01L 21/00
(52) U.S. Cl. .................. 438/716; 438/720; 438/729
(58) Field of Search .................. 156/643.1, 654.1, 156/657.1, 345 WH; 438/716, 720, 729

(56) References Cited

U.S. PATENT DOCUMENTS 4,306,731 A * 12/1981 Shaw ........................ 279/4
4,898,639 A * 2/1990 Moe et al. .................. 156/345
5,215,619 A * 6/1993 Cheng et al. ............... 156/345
5,281,320 A * 1/1994 Turner et al. .......... 204/298.15
5,292,399 A * 3/1994 Lee et al. .................... 438/716
5,292,558 A * 3/1994 Heller et al. ................ 427/533

FOREIGN PATENT DOCUMENTS

EP 0 312 986 A1 4/1989
EP 0 342 688 A2 11/1989

* cited by examiner

Primary Examiner—Kathryn Gorgos
Assistant Examiner—W. T. Leader
(74) Attorney, Agent, or Firm—Herbert Lerner; Laurence Greenberg; Werner Stemer

(57) ABSTRACT

A method for back-etching of tungsten-coated substrate surfaces in the production of large-scale integrated circuits includes pressing a substrate against a cooled specimen holder during back-etching with a retaining ring being disposed on an edge of the substrate and only locally retaining the edge of the substrate with the retaining ring at retaining locations distributed over the circumference of the retaining ring. The retaining locations are backup-free relative to etching products liberated in the back-etching, causing the etching products to flow past the retaining locations and be purposefully deposited outside the substrate surface.

7 Claims, 2 Drawing Sheets

METHOD FOR PREVENTING REDEPOSITION OF ETCHING PRODUCTS ONTO SUBSTRATE SURFACES DURING A TUNGSTEN RE-ETCHING PROCESS IN THE PRODUCTION OF LSI CIRCUITS

BACKGROUND OF THE INVENTION

Field of the Invention

The invention relates to a method for the back-etching of tungsten-coated substrate surfaces in the production of large-scale integrated (LSI) circuits, in which the substrate is pressed against a cooled specimen holder during the back-etching through the use of a retaining ring disposed on the periphery or edge of the substrate.

In microelectronic components, the various conductive layers, for instance a doped silicon substrate, polysilicon or metal tracks, are separated from one another by insulators (such as $SiO_2$). In order to obtain functional circuits, the individual conductive layers must be contacted with one another at suitable points. To that end, as a rule, holes, which are known as contact holes or vias, are etched into the insulators and then conductive material is introduced into the holes. In submicrometer technology, a suitable method that has come to be established is to fill those holes with tungsten that is chemically deposited from the gas phase (TCVD process). A known procedure is to first deposit a TCVD layer of tungsten hexafluoride $WF_6$ and $H_2$ or $SiH_4$. That layer is deposited over a TiN or TiW underlay (adhesive layer, barrier) and grows both on the entire substrate surface and bottom and side walls of the hole, until in the case of the side walls the layer grows together, closing over. In a subsequent step, which is back-etching, the conductive layer previously deposited on the horizontal substrate surface is removed entirely again, so that in the ideal case the contact holes or vias remain, completely filled with conductive material.

In tungsten back-etching, it is necessary for the substrate to be pressed against a cooled specimen holder (pedestal) through the use of a retaining device, known as a retaining or clamp ring. Due to machining tolerances and surface roughness, a microscopic void or gap in fact results between the pedestal and the substrate and is detrimental to good substrate cooling. In order to obtain better cooling of the substrate, the void between the substrate and the pedestal is therefore filled with helium, which is supplied through the pedestal. In order to prevent helium from reaching the front side of the substrate and thus to assure that the substrate will not be forced away from the pedestal by the helium being fed in, the substrate is pressed against the specimen holder by a retaining ring. Heretofore, the retaining ring has been constructed in such a way that it completely surrounds the substrate. The back-etching step is typically carried out in a plasma containing fluorine and/or chloride, and the most important influences of the process parameters on various target variables are already known per se.

Through the use of that known method, not only is the goal to fill the contact holes or vias with conductive material but also to achieve a substrate surface that is free of tungsten residues after the tungsten back-etching. That requirement of the back-etching process of removing all of the conductive material from the substrate surface is important if short circuits between tracks being produced later are to be avoided. In order to achieve that freedom from tungsten, the back-etching step is delayed timewise. In other words, over-etching is carried out until the surface of the TiN or TiW underlay (adhesive layer, barrier) is free of tungsten residues. As a result of that over-etching, the adhesive layer is thinned and sometimes even removed completely locally, especially in the peripheral region. The etching products which are thus liberated precipitate onto the periphery or edge of the substrate. That precipitation is concentrated in a region of the substrate retaining device that comes directly into contact with the substrate. If the substrate is then placed in the atmosphere after the end of the back etching process, the precipitation mixes with the oxygen contained in room air. The mixture is also no longer removed in subsequent work steps (such as rinsing with water) that are contained in the further course of the process.

If further conductive or nonconductive layers are next applied over the entire surface, then in the region of the "precipitation" or in other words redeposition, layer separations occur as a consequence of the strains in the layers which are applied. The undesired, problematic layer separations represent a "particle burden" for the substrate surface. The particle burden results in yield losses and substrate rejection.

After the tungsten back-etching, the "precipitation" (redeposition) was heretofore removed by time-consuming rinses with water. The success of such water rinses was not replicable, and at the same time water rinses on metal layers should largely be avoided and restricted in duration. Process conversions in the over-etching phase that are intended to reduce the precipitation, and in-situ plasma cleaning steps that followed the tungsten back-etching process were likewise unsuccessful.

SUMMARY OF THE INVENTION

It is accordingly an object of the invention to provide a method for preventing redeposition of etching products onto substrate surfaces during a tungsten re-etching process in the production of LSI circuits, which overcomes the hereinafore-mentioned disadvantages of the heretofore-known methods of this general type and which helps to avoid problems in the undesirable redeposition described above.

With the foregoing and other objects in view there is provided, in accordance with the invention, a method for back-etching of tungsten-coated substrate surfaces in the production of large-scale integrated circuits, which comprises pressing a substrate against a cooled specimen holder during back-etching with a retaining ring being disposed on an edge of the substrate and only locally retaining the edge of the substrate with the retaining ring at retaining locations distributed over the circumference of the retaining ring, the retaining locations being backup-free relative to etching products liberated in the back-etching, causing the etching products to flow past the retaining locations and be purposefully deposited outside the substrate surface.

In accordance with another mode of the invention, there is provided a method which comprises distributing at least three retaining locations extending in prong-like fashion on the retaining ring as far as the edge of the substrate.

In accordance with a further mode of the invention, there is provided a method which comprises distributing the retaining locations as retaining locations being tapered to a point or rounded in a curve at ends facing toward the substrate.

In accordance with an added mode of the invention, there is provided a method which comprises selecting a width, a height and a length of at least a few millimeters for the prong-like retaining locations, and in particular selecting the width and the height of the prong-like retaining locations to be in a range of approximately 2 mm.

In accordance with an additional mode of the invention, there is provided a method which comprises distributing the retaining locations as prong-like retaining locations being flattened toward ends facing toward the substrate.

In accordance with a concomitant mode of the invention, there is provided a method which comprises covering the edge of the substrate with clearance with an additional covering ring resting on the retaining ring.

Other features which are considered as characteristic for the invention are set forth in the appended claims.

Although the invention is illustrated and described herein as embodied in a method for preventing redeposition of etching products onto substrate surfaces during a tungsten re-etching process in the production of LSI circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
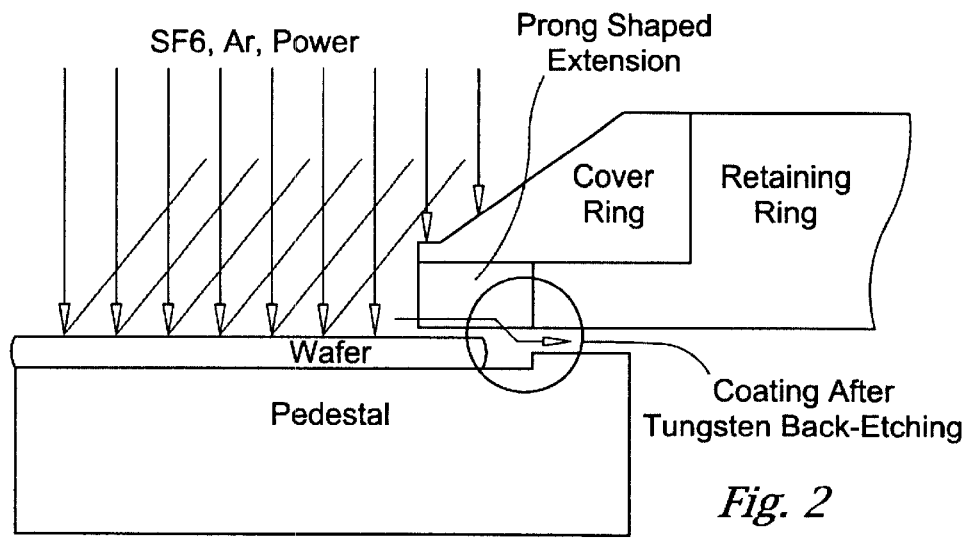
Figure 3A:
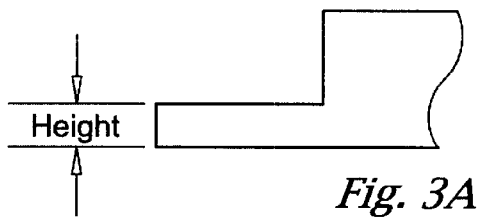
Figure 3B:
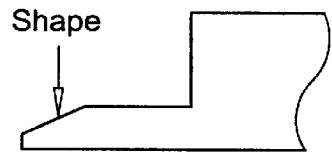
Figure 3C:
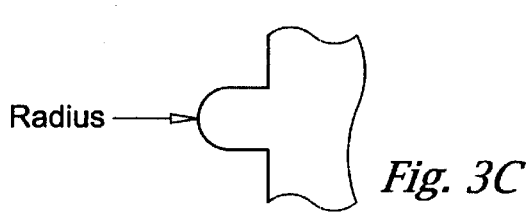
Figure 3D:
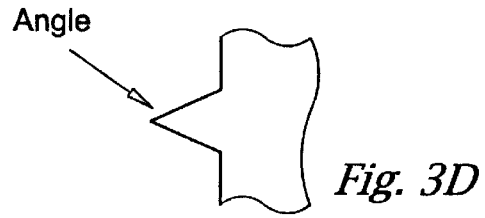
Figure 3E:
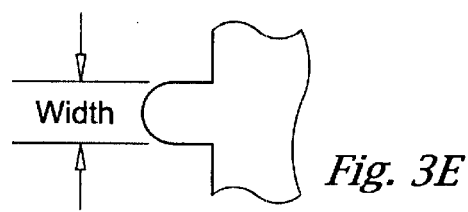
Figure 3F:
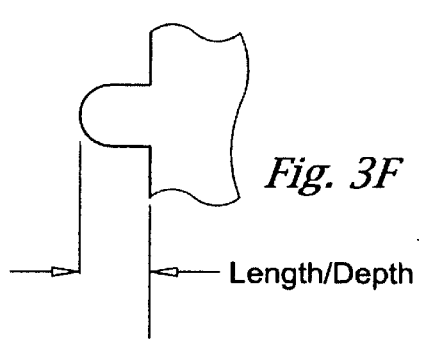

a) tungsten deposition, and b) back-etching, and ensuing c) aluminum metallizing;

FIG. 2 is an enlarged, fragmentary, cross-sectional side view of a substrate which is retained according to the invention by a retaining ring; and FIGS. 3A–3F are a group of fragmentary, cross-sectional views showing details of retention points of the retaining ring of FIG. 2.

DESCRIPTION OF THE PREFERRED EMBODIMENTS

Referring now to the figures of the drawing in detail and first, particularly, to FIG. 1 thereof, there is seen a prior art device of the type described above, in which a tungsten layer is deposited on a Ti/TiN underlay. A wafer or substrate is pressed against a cooled pedestal or specimen holder by a retaining ring or device.

Figure 1A:
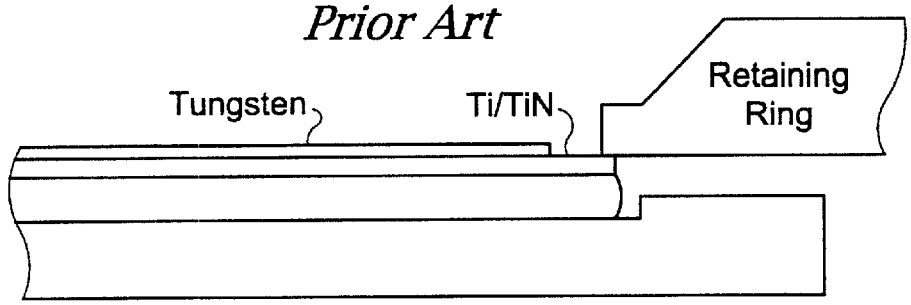
FIG. 1 is a fragmentary, diagrammatic, cross-sectional side views respectively showing results of the following successive process steps.
Figure 1B:
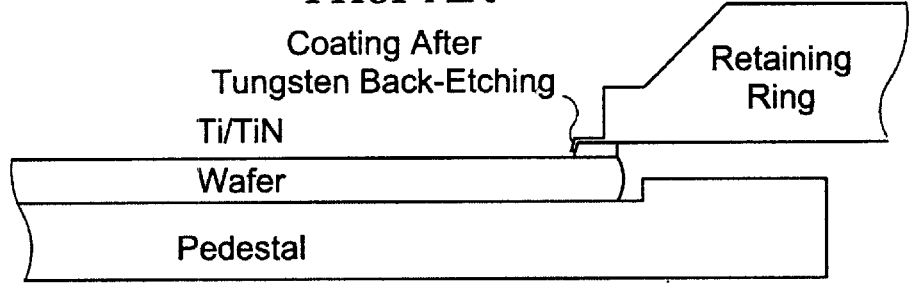
Figure 1C:
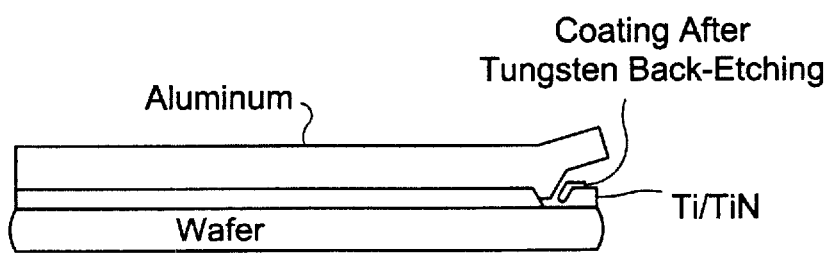

The successive prior art process steps are illustrated as tungsten deposition in FIG. 1a, back-etching in FIG. 1b, and ensuing aluminum metallizing in FIG. 1c. The precipitation is concentrated in a region of the substrate retaining device that comes directly into contact with the substrate. If the substrate is then placed in an atmosphere after the end of the back etching process, the precipitation mixes with the oxygen contained in room air. That mixture is also no longer removed in subsequent work steps (such as rinsing with water) that are contained in the further course of the process.

If further conductive or nonconductive layers are then applied over the entire surface, as is suggested in FIG. 1, then in the region of the "precipitation" or in other words redeposition, layer separations occur as a consequence of the strains in the layers that are applied. The undesired, problematic layer separations represent a "particle burden" for the substrate surface. That particle burden results in yield losses and substrate rejection.

In contrast, the invention is based on the discovery that the deleterious deposition performance can be ascribed solely to the substrate retainer, and that the described effect of the precipitation of etching products onto the substrate surface can be avoided entirely in the immediate vicinity of a substrate retaining ring by modifying the substrate retaining ring in such a way that the etching products are purposefully deposited outside the substrate surface. This is achieved by constructing the retaining ring in such a way that the substrate is retained only locally or in pointwise fashion by the substrate retainer. It can be said that the substrate according to the invention is held only by individual "prongs". In order to provide a purposeful deposition of the undesired etching products outside the substrate, the form and dimensions of the prongs and of the retaining ring are decisive.

At least three of the prong-like retention points extending over the substrate rim should be extending from the retaining ring. A larger number, for instance 24 retention points distributed about the circumference, is even more advantageous. A large number of retention points that are constructed in cone-like fashion can also be considered.

In the sectional view of FIG. 2, for the sake of better comprehension, the front end of the prong-like retention point that extends across the substrate rim has been shown only as a blank rectangle. The etching gas/etching products flowing past the retention points and between them are deposited purposefully as shown, outside the substrate surface. This process is intended to be emphasized by a circle indicated in FIG. 2, which otherwise has no significance.

A backup of etching products at the retention points, which would lead to an undesired deposit there, can be avoided through the use of a shaping of the retention points shown in FIG. 3, which are constructed in such a way as to taper to a point or be rounded in curved fashion on ends thereof facing toward the substrate. In the case of the prong-like retention points, a width, height and length of at most a few millimeters should be chosen, and in particular the width and the height should be in the range of approximately 2 mm. If the retaining locations or points were too small, excessive retention force would be exerted locally on the wafer, with the risk of damage. If the length were too great, the gas would have to flow too far. On the other hand, a minimum height is needed so that the gas can flow past unhindered. In order to avoid a backup it is advantageous for the prong-like retention points to be flattened toward their ends facing toward the substrate.

FIG. 2 also shows an additional covering ring that rests on the retaining ring and covers the periphery or edge of the substrate with clearance. This expendable part protects the retaining ring or pedestal from the influence of the plasma.

The locations of the decisive dimensions and shapes (width, height, radius, angle and length of the prongs) for the production of a retaining ring are shown in FIGS. 3A–3F.

In order to make a substrate retaining ring, an aluminum oxide ceramic is preferred in terms of material. Such other materials as plasma-resistant plastics or aluminum could also be used, as long as they are typical materials employed in plasma etching. However, in order to provide the outcome which is sought, all that is important is the structure of the substrate retaining ring, the combination of the aforementioned dimensions and forms with one another, and the spacing of the retaining prongs from one another. According to the invention, the substrate retaining ring can be used, for instance, in a CVD and back-etching system of the type of the AMT P5000 made by the corporation known as Applied Materials.

The following parameters and process properties can be employed:

a) Assurance of effective wafer cooling, so that the actual wafer temperature, even during the plasma etching process, does not exceed 70° C. and ideally is below 40°. The success of the method is not dependent on the way in which the wafer cooling itself is achieved. Either a static helium pressure of 5 to 50 Torr can be built up, or a dynamic helium flow can be established, between the wafer and the cooled support (pedestal).

b) A suitably chosen mixture of etching gases. Mixtures of sulfur hexafluoride $SF_6$, or alternatively $CF_4$, $CHF_3$, $C_2F_6$ and one or more of the inert gases He, Ar, $N_2$ have proved successful. Oxygen can be added to the etching gas mixture but is not necessary for success if $SF_6$ is used.

c) A suitable choice of the parameters of "total pressure" and "total gas flow", in such a way that the etching reaction takes place under the circumstances of transport-controlled or diffusion-controlled kinetics.

d) The preferred construction of the surfaces of the surrounding materials in the etching chamber of aluminum or ceramic and therefore of materials that do not bond or use etching radicals.

The following parameters are provided as a typical exemplary embodiment of magnetically enhanced reactive ion etching (MERIE) of tungsten:

|  | Typical Range | Ideal Range |
| --- | --- | --- |
| Plasma power (W) | 50–1000 | 150–600 |
| Pressure (mTorr) | 5–500 | 50–300 |
| $SF_6$ flow (sccm) | 10–500 | 50–250 |
| Inert gas (He, Ar, $N_2$; sccm) | 0–500 | 20–200 |
| Pedestal temperature (° C.) | 5–70 | 15–40 |
| He coolant gas flow (sccm) | 5–100 | 10–50 |
| Magnetic field (Gauss) | 0–300 | 0–100 |

We claim:

1. A method for back-etching of tungsten-coated substrate surfaces in the production of large-scale integrated circuits, which comprises:

pressing a substrate against a cooled specimen holder during back-etching with a retaining ring having prong-shaped extensions disposed next to the substrate and only locally pressing the periphery of the substrate with the prong-shaped extensions extending from the retaining ring and over the periphery of the substrate, the prong-shaped extensions being back-up free relative to etching products liberated in the back-etching, causing the etching products to flow past the prong-shaped extensions and be purposefully deposited outside the substrate surface.

2. The method according to claim 1, which comprises distributing at least three prong-shaped extensions over the periphery of the substrate.

3. The method according to claim 2, which comprises distributing the prong-shaped extensions as prong-shaped extensions being tapered to a point at ends facing toward the substrate.

4. The method according to claim 2, which comprises distributing the prong-shaped extensions as prong-shaped extensions being rounded in a curve at ends facing toward the substrate.

5. The method according to claim 2, which comprises selecting the width and the height of the prong-shaped extensions to be in a range of approximately 2 mm.

6. The method according to claim 2, which comprises distributing the prong-shaped extensions as prong-shaped extensions being flattened toward ends facing toward the substrate.

7. The method according to claim 2, which comprises covering the edge of the substrate with clearance with an additional covering ring resting on the retaining ring.

* * * * *